(12) United States Patent
Borgatti et al.

(10) Patent No.: US 7,360,068 B2
(45) Date of Patent: Apr. 15, 2008

(54) RECONFIGURABLE SIGNAL PROCESSING IC WITH AN EMBEDDED FLASH MEMORY DEVICE

(75) Inventors: Michele Borgatti, Finale Emilia (IT); Lorenzo Cali', Monza (IT); Francesco Lertora, San Colombano Certenoli (IT); Marco Pasotti, San Martino Siccomario (IT); Pier Luigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 410 days.

(21) Appl. No.: 10/768,401

(22) Filed: Jan. 30, 2004

(65) Prior Publication Data

US 2004/0230771 A1 Nov. 18, 2004

(30) Foreign Application Priority Data

Jan. 31, 2003 (EP) .................................. 03425054

(51) Int. Cl.
*G06F 13/00* (2006.01)

(52) U.S. Cl. ..................................................... 712/226

(58) Field of Classification Search ................ 712/226, 712/225, 232
See application file for complete search history.

(56) References Cited

U.S. PATENT DOCUMENTS

| | | | | |
|---|---|---|---|---|
| 5,693,570 | A | 12/1997 | Cernea et al. | ............... 437/205 |
| 5,982,368 | A * | 11/1999 | Toffolo et al. | ............... 715/835 |
| 6,272,584 | B1 * | 8/2001 | Stancil | ........................ 710/241 |
| 6,311,273 | B1 * | 10/2001 | Helbig et al. | ................... 726/2 |
| 6,467,009 | B1 | 10/2002 | Winegarden et al. | ........ 710/305 |
| 6,662,314 | B1 * | 12/2003 | Iwata et al. | ..................... 714/42 |
| 6,720,968 | B1 * | 4/2004 | Butler et al. | ................. 345/535 |
| 6,845,276 | B2 * | 1/2005 | Bocchi | .......................... 700/61 |
| 6,938,177 | B1 * | 8/2005 | Blemel | ........................ 713/500 |
| 2002/0060336 | A1 * | 5/2002 | Kuo et al. | .................... 257/315 |

OTHER PUBLICATIONS

Brown, S., and J. Rose, FPGA and CPLD Architectures: A Tutorial. IEEE Design and Test of Computers, 1996, pp. 42-57.*
Eclipse-II FPGAs for Low Power Applications QuickLogic White paper, QuickLogic Corporation, 2003 pp. 1-7.*
David et al., DART: A Dynamically Reconfigurable Architecture Dealing with Future Mobile Telecommunications Constraints, Parallel and Distributed Processing Symposium, Apr. 15, 2002, pp. 156-163.
XC6200 Field programmable Gate Arrays Product Description, Apr. 24, 1997, p. 31.

* cited by examiner

*Primary Examiner*—Eric Coleman
(74) *Attorney, Agent, or Firm*—Lisa K. Jorgenson; Allen, Dyer, Doppelt, Milbrath & Gilchrist, P.A.

(57) ABSTRACT

A dynamically reconfigurable processing unit includes a microprocessor, and an embedded Flash memory for non-volatile storage of code, data and bit-streams. The embedded Flash includes a field programmable gate array (FPGA) port. The reconfigurable processing unit further includes a direct memory access (DMA) channel, and an S-RAM embedded FPGA for FPGA reconfigurations. The S-RAM embedded FPGA has an FPGA programming interface connected to the FPGA port of the Flash memory through the DMA channel. The microprocessor, the embedded Flash memory, the DMA channel and the S-RAM embedded FPGA are integrated as a single chip.

32 Claims, 6 Drawing Sheets

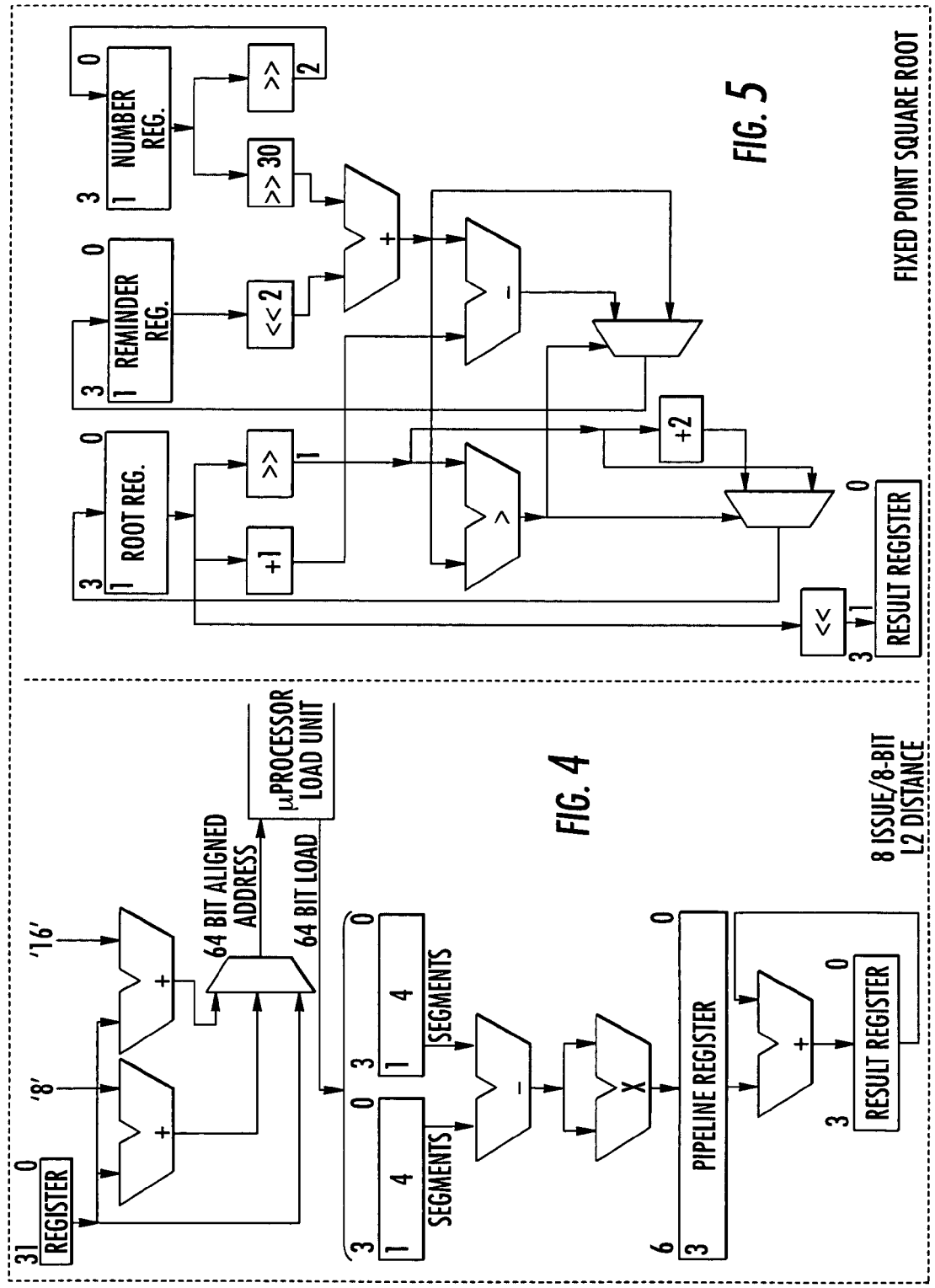

| ALGORITHM STAGE | RISC WITH BASIC DSP INSTRUCTION SUPPORT | RISC WITH MICROPROCESSOR EXTENSIONS | SPEED UP | ENERGY GAIN | ENERGY EFFICIENCY GAIN (ENERGY x DELAY) |
|---|---|---|---|---|---|
| BAYER FILTER | 58 MSEC | 24.7 MSEC | x2.3 | x1.4 | x3.22 |
| EDGE DETECTION | 4.5 MSEC | 2.5 MSEC | x1.8 | x0.95 | x1.71 |
| FACE DETECTION | 1.5 SEC | 382 MSEC | x4 | x2.9 | x11.6 |
| FACE RECOGNITION (TWENTY FACE DATABASE) | 9.15 SEC | 860 MSEC | x10.6 | x9 | x95.4 |
| TOTALS | 10.7 SEC | 1.26 SEC | x8.5 | x6.7 | |

FIG. 6

RECONFIGURABLE SIGNAL PROCESSING IC WITH AN EMBEDDED FLASH MEMORY DEVICE

FIELD OF THE INVENTION

The present invention relates to dynamically reconfigurable processing units connected to a Flash EEPROM memory subsystem. More specifically, the present invention relates to a reconfigurable signal processing integrated circuit with an embedded Flash memory device for non-volatile storage of code, data and bit-streams. The unit is integrated into a single chip together with a microprocessor core.

BACKGROUND OF THE INVENTION

Increasing complexity of system design and shorter time-to-market requirements are leading research towards the investigation of hybrid systems including processors enhanced by programmable logic as readily known by those skilled in this technical field. In this respect, reference is made to the work by Young-Don Bae et al., "A Single-Chip Programmable Platform Base on A Multithreaded Processor and Configurable Logic Clusters", ISSCC 2002 Digest of Technical Papers, pp 336-337, February 2002. Moreover, a further reference which may be considered is an article by Zhang et al., "A 1V Heterogeneous Reconfigurable Processor IC for Baseband Wireless Applications", ISSCC 2000 Digest of Technical Papers, pp 68-69,488, February 2000.

At the same time increased costs of mask sets and a shorter time-to-market available for new products are leading to the introduction of systems with a higher degree of programmability and configurability, such as system-on-chips with configurable processors, embedded FPGA and embedded flash memory. Moreover, the availability of an advanced embedded flash technology, based on a NOR architecture, together with innovative IP's, like embedded flash macrocells with special features, is a key factor.

For a better understanding of the present invention reference is also made to the Field Programmable Gate Array (FPGA) technology combining standard processors with embedded FPGA devices. These approaches allow one to configure into the FPGA at deployment time exactly the required peripherals, exploiting temporal reuse by dynamically reconfiguring the instruction set at run time based on the currently executed algorithm.

The existing models for designing FPGA/processor interaction can be grouped in two main categories: 1) the FPGA is a co-processor communicating with the main processor through a system bus or a specific I/O channel; and 2) the FPGA is described as a function unit of the processor pipeline. The first group includes the GARP processor, known from the article by T. Callahan, J. Hauser, and J. Wawrzynek, "The Garp Architecture And C Compiler" IEEE Computer, 33(4): 62-69, April 2000. A similar architecture is provided by the A-EPIC processor that is disclosed in the article by S. Palem and S. Talla, "Adaptive Explicit Parallel Instruction Computing", Proceedings of the fourth Australian Computer Architecture Conference (ACOAC), January 2001.

In both cases the FPGA is addressed via dedicated instructions, moving data explicitly to and from the processor. Control hardware is kept to a minimum since no interlocks are needed to avoid hazards, but a significant overhead in clock cycles is required to implement communication. When the number of cycles per execution of the FPGA is relatively high, the communication overhead may be considered negligible.

In the commercial world, FPGA suppliers such as Altera Corporation offer digital architectures based on U.S. Pat. No. 5,968,161 to T. J. Southgate, "FPGA Based Configurable CPU Additionally Including Second Programmable Section For Implementation Of Custom Hardware Support". Other suppliers (Xilinx, Triscend) offer chips containing a processor embedded on the same silicon IC with embedded FPGA logic. See for instance U.S. Pat. No. 6,467,009 to S. P. Winegarden et al., "Configurable Processor System Unit", assigned to Triscend Corporation.

However, those chips are generally loosely coupled by a high speed dedicated bus, performing as two separate execution units rather than being merged in a single architectural entity. In this manner the FPGA does not have direct access to the processor memory subsystem, which is one of the strengths of academic approaches outlined above. In the second category (FPGA as a function unit) we find architectures commercially known as PRISC, Chimaera and ConCISe.

In all these models, data is read and written directly on the processor register file minimizing overhead due to communication. In most cases, to minimize control logic and hazard handling and to fit in the processor pipeline stages, the FPGA is limited to combinatorial logic only. This severely limits the performance boost that can be achieved.

These approaches represent a significant step toward a low-overhead interface between the two entities. Nevertheless, due to the granularity of FPGA operations and its hardware oriented structure, their approach is still very coarse-grained, reducing the possible resource usage in parallel and again including hardware issues not familiar nor friendly to software compilation tools and algorithm developers.

Thus, a relevant drawback in this approach is often the memory data access bottleneck that often forces long stalls on the FPGA device when fetching on the shared registers enough data to justify its activation.

SUMMARY OF THE INVENTION

An object of the present invention is to provide a reconfigurable processing unit that is connected to a memory architecture having functional and structural features offering significant performance and power consumption enhancements with respect to a traditional signal processing device.

The invention overcomes the limitations of similar preceding architectures relying on an embedded device of a different nature, and this is based upon a new approach to processor/memory interface. According to a first embodiment of the present invention, the reconfigurable processing unit targets image-voice processing and recognition application domains by joining a configurable and extensible processor core and an SRAM-based embedded FPGA.

More specifically, the processing unit according to the invention may includes an S-RAM based embedded FPGA unit structured for FPGA reconfigurations having a specific programming interface connected to a port FA of the Flash memory device through a direct memory access (DMA) channel.

BRIEF DESCRIPTION OF THE DRAWINGS

The features and advantages of the processing unit according to the present invention will become apparent from the following description of a best mode for carrying out the invention given by way of a non-limiting example with reference to the enclosed drawings.

FIG. 4 is a block diagram of a specific processor extension according to the present invention with respect to added DSP instruction examples;

FIG. 5 is a block diagram of a further specific processor extension according to the present invention with respect to an optimized fixed-point calculation of the square root accounts;

FIG. 6 is a table view showing the overall performance improvements for a face recognition task implemented by the processing unit of the present invention.

DETAILED DESCRIPTION OF THE PREFERRED EMBODIMENTS

Figure 1:
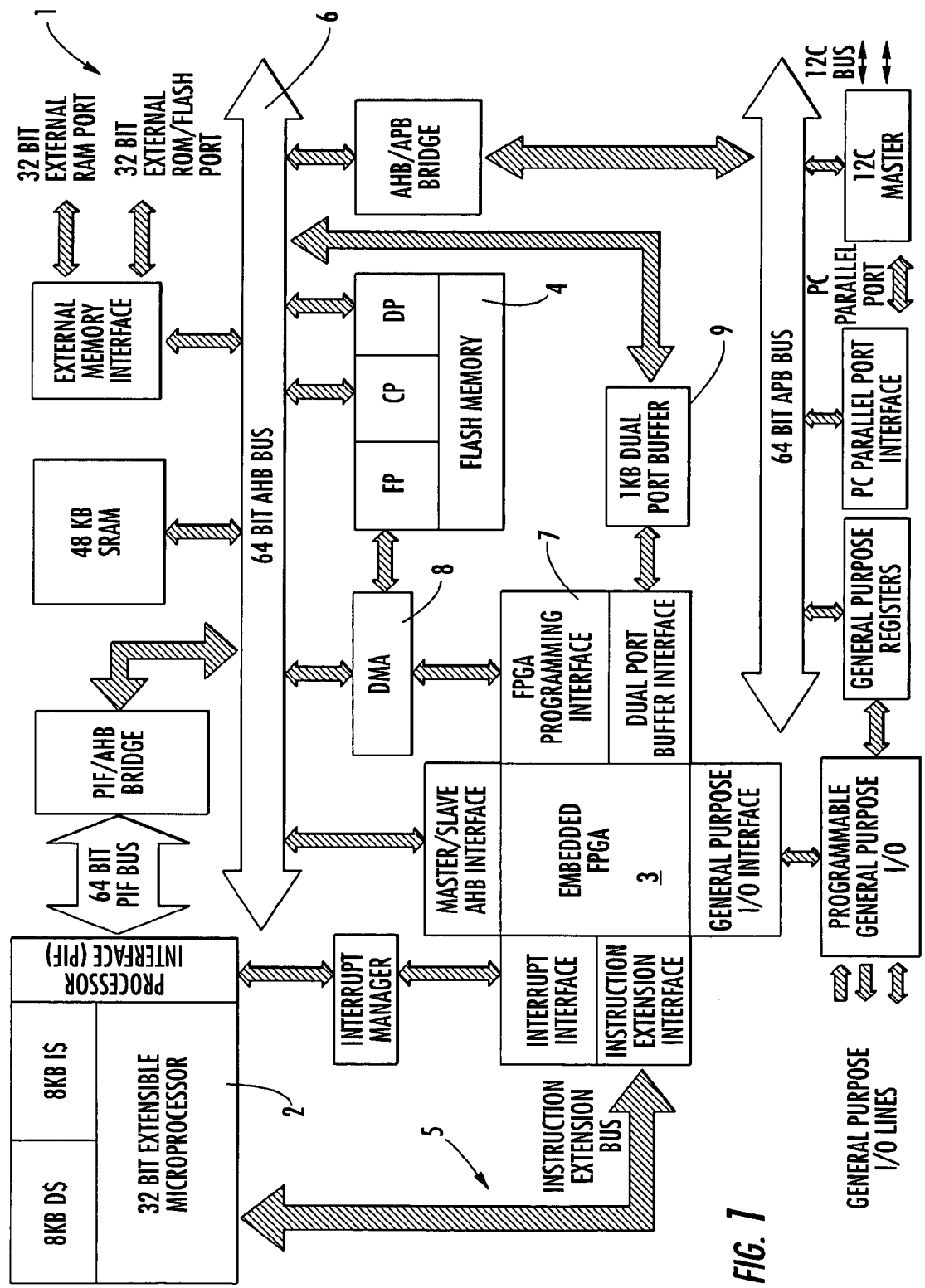
FIG. 1 is a block diagram of a processing unit architecture for data processing according to the present invention.

With reference to the drawings, generally shown at 1 is a processing unit formed according to the present invention for digital signal processing based on reconfigurable computing. The processing unit 1 includes an embedded Flash memory 4 for non-volatile storage of code, data and bit-streams, and an additional S-RAM based embedded FPGA 3 formed for the configuration purposes of the present invention. More specifically, an 8 Mb application-specific embedded flash memory 4 is disclosed. The memory 4 is integrated into a single chip together with a microprocessor 2 and the FPGA structure 3.

Advantageously, application-specific hardware units are added and dynamically modified by the embedded FPGA 3 reconfiguration. By implementing application-specific vector processing instructions the processing unit 1 shows a peak computing power of 1 GOPS.

Efficient read-write-erase access to code, data and FPGA bitstreams is provided by the Flash memory 4 based on a modular 8 Mb, 4-bank Flash memory, as will be more clearly explained below.

The processing unit 1 comprises three content-specific I/O ports and delivers an aggregate peak read throughput of 1.2 GB/s. The system architecture 1 is illustrated in FIG. 1. The functional purposes of the embedded FPGA 3 are as follows: i) extension of the processor datapath supporting a set of additional special purpose C-callable microprocessor instructions; ii) bus-mapped coprocessors connected to the system bus through a master/slave interface; and iii) flexible I/O to connect external units or sensors with application-specific communication protocols.

Even though such different circuit purposes would require different kinds of programmable logic for best implementation of either arithmetic-dominated or control-dominated logic, a single programmable logic subsystem 3 has been implemented to be shared among different purposes both in space (same configuration) and time (subsequent configurations).

The single, high I/O count, fine-grain e-FPGA 3 operates as a datapath for the microprocessor pipeline and as dedicated control logic for bus coprocessor and I/O control interface. The FPGA has a specific programming interface 7 connected to a port FP of said Flash memory device 4 through a DMA channel 8. FPGA reconfiguration is concurrent with software execution.

Figure 2:
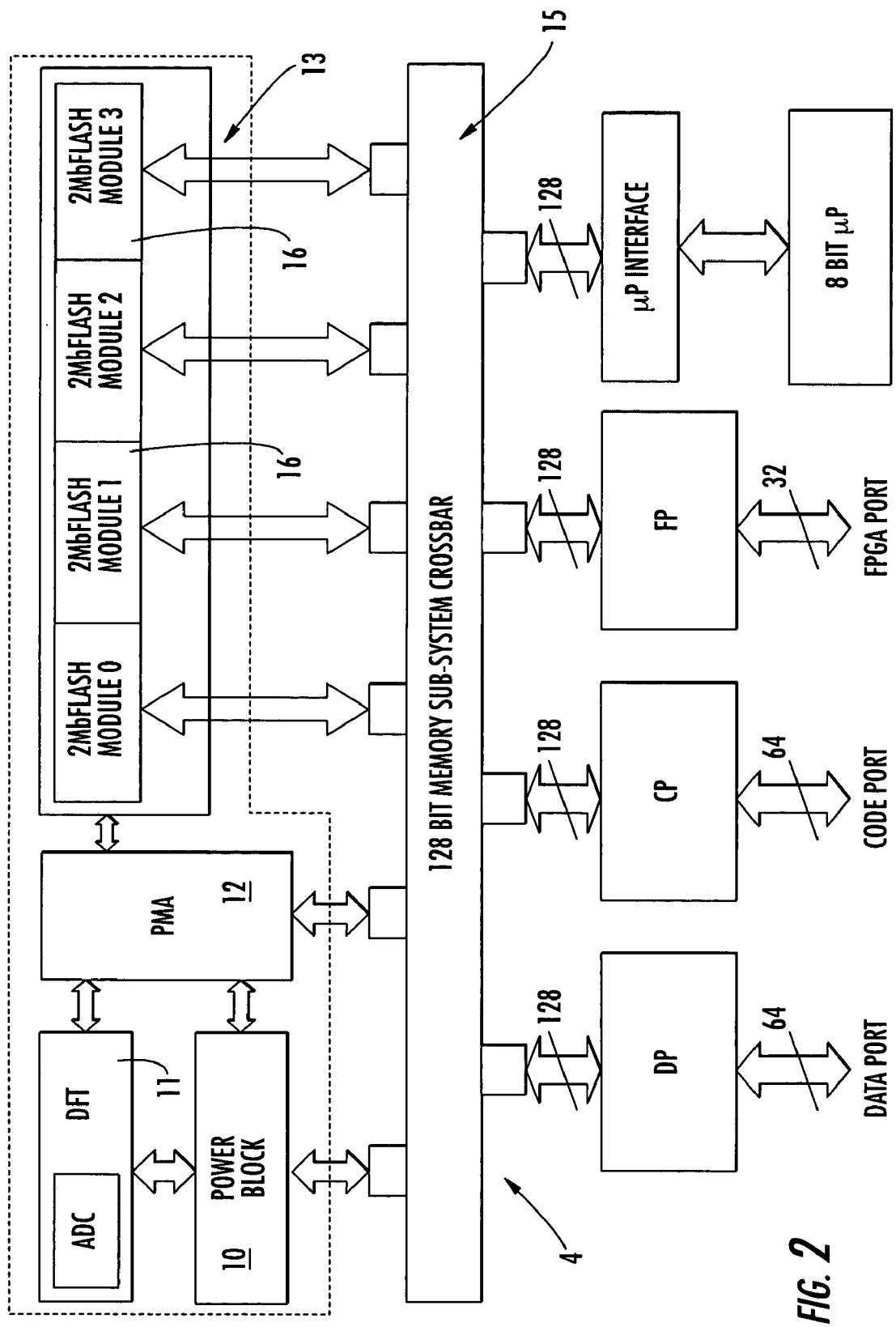
FIG. 2 is a block diagram of a Flash memory architecture embedded into the processing unit of FIG. 1.

A local bus 6 connects a dedicated 32-bit Flash memory port FP to the FPGA programming interface 7. A DMA channel 8 handles the bitstream transfer while the microprocessor 2 fetches instructions and data from different Flash memory ports: 64-bit wide code port (CP) and data port (DP). To support streaming applications a 1 kB dual-port buffer 9 is used to interface fast decoding hardware and slower software running on the processor 2. The memory sub-system architecture is shown in FIG. 2.

The modular structure of the memory (dotted line) includes: charge pumps 10 (Power Block), testability circuits 11 (DFT), a power management arbiter 12 (PMA), and a customizable array 13 of N independent 2 Mb flash memory modules 16. Depending on the storage requirements the number N may be chosen with N=4 in the current implementation.

The modular memory features (N+2) 128-bit target ports and implements an N-bank uniform memory 13. As previously mentioned, three content-specific ports are dedicated to code (CP, 64-bit wide), data (DP, 64-bit) and FPGA bit stream configurations (FP, 32-bit). A 128 bit sub-system crossbar 15 connects all the architecture blocks and the eight bit microprocessor 2.

The main features of the flash memory device 4 includes a charge pump 10 sharing among different flash memory modules 16 through the PMA arbiter 12 in a multi-bank fashion. Moreover, the use of a small eight bit microprocessor 2 allows easy memory system test and adds complex functionalities for data management, and the use of an ADC (Analog-to-Digital Converter), required by the application, increase system self-test capability.

The third FP port of the Flash device 4 is dedicated to manage embedded-FPGA (e-FPGA) configurations data stored in flash memory modules. The FP port is read-only and provides fast sequential access for bit stream downloading. The FP has four configuration registers replicating the information stored in CP port that must be used to write e-FPGA configurations data.

The output data word bus and the address bus are 32 bits wide. The FP port uses a chip select to access in the addressable memory space, and a burst enable to allow burst serial access. In a read operation, an output ready signal is tied low when data is not immediately available, so that it can act as a wait state signal.

The eight-bit microprocessor 2 (uP) performs additional complex functions (defragmentation, compression, virtual erase, etc.) not natively supported by the DP port, and assists for built-in self-test of the memory system. The (N+2)×4 128-bit crossbar 15 connects the modular memory with the four initiators (CP, DP, FP and uP) providing that at least three flash memory modules 16 can be read in parallel at full speed.

The memory space of the four modules 16 is arranged in three programmable user-defined partitions, each one devoted to a port. The memory system clock can run up to 100 MHz, and reading three modules 16 with a 128 bit data bus and 40 ns access time results in a peak read throughput of 1.2 GB/s. Each 2 Mb flash memory module 16 has a 128-bit IO data bus with 40 ns access time, resulting in 400 Mbyte/s, and a program/erase control unit. Simultaneous memory operations use the power management arbiter 12 (PMA) for optimal scheduling.

Available power and user-defined priorities are considered to schedule conflicting resource requests in a single clock cycle. The memory device 4 allows up to four simultaneous operations, with a limit of one both for write and erase.

Figure 3:
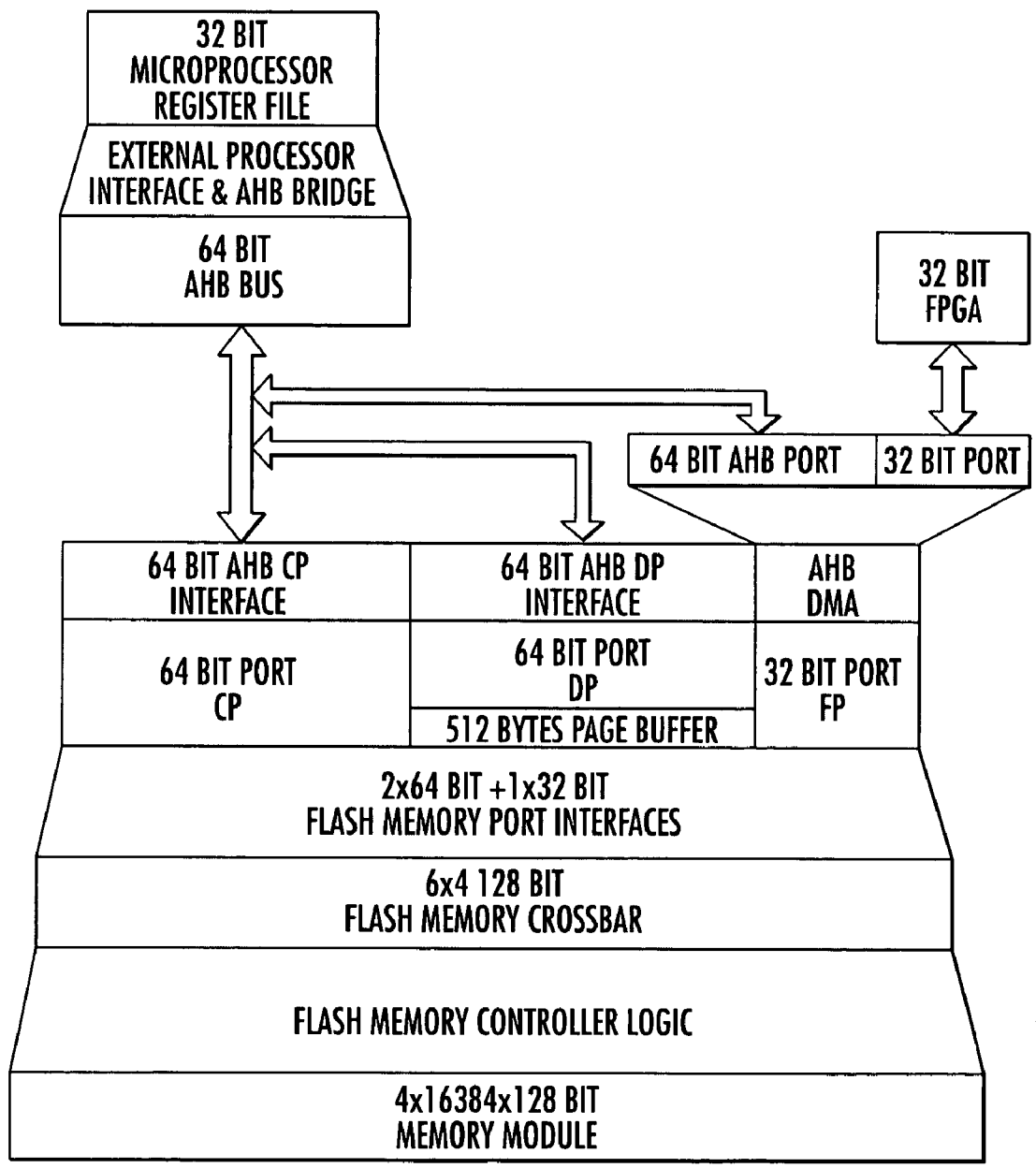
FIG. 3 is a schematic view of a system memory hierarchy provided by the present invention.

FIG. 3 depicts the memory hierarchy and its parallel architecture across the processing unit 1. The ports CP and DP are interfaced to the 64-bit, 800 MB/s AHB system bus 6. At a system clock rate of 100 MHz each I/O port can independently operate at maximum speed. An aggregate peak read rate of 1.2 GB/s can thus be sustained as it is limited by memory access time. In the current implementation, the e-FPGA reconfiguration takes 500 µs at 100 MHz. 50 MB/s average throughput out of the available 400 MB/s are currently sustained by the e-FPGA configuration interface 7.

System performance was evaluated for an image processing application (facial recognition) and a speech recognition application. More than 20 specific instructions were designed as C/assembly-callable functions, automatically translated to RTL, then synthesized and mapped to the e-FPGA.

FIGS. 4 and 5 show two examples of specific microprocessor extensions. FIG. 4 relates to an eight-issue, eight-bit, L2 calculation accounts for 23 eight-bit arithmetic operations and six 64-bit operations requiring about 10 k ASIC equivalent gates.

FIG. 5 relates to a datapath for an optimized fixed-point calculation of the square root accounts for twelve 32-bit operations for about 2 k ASIC equivalent gates. The overall performance improvements for the face recognition tasks are shown in FIG. 6.

Execution time is compared for a 32-bit RISC with basic DSP extensions (MAC, zero-overhead loops, etc) and the same processor enhanced with application-specific instructions. Measured speed-ups range from 1.8×to 10.6×(on the most-demanding task), with an overall improvement of 8.5×. Switching between algorithm stages requires only one reconfiguration of the e-FPGA. Reconfiguration time is negligible.

The speed-up factors take into account the possible multicycle clock penalty due to processor-FPGA synchronization in case of instruction extensions slower than the processor clock. Energy efficiency figures are reported in FIG. 6 also.

As the average power consumption of the system extended with the e-FPGA is slightly higher (10-15%), the energy reduction for executing each of the tasks on its specific HW configuration (power-delay product improvement) results in an overall reduction of 6.7×. Only one task showed slightly worse total execution energy, though showing benefits on execution speed.

The last column of FIG. 6 reports the power-delay improvement of each specific HW configuration compared to the general-purpose counterpart. Energy required for e-FPGA reconfiguration is always negligible. Measurements show the best energy efficiency in the range of several MOPS/mW at 1.8V supply. It lies between conventional ASIP/DSP and dedicated configurable hardware implementations.

Figure 7:
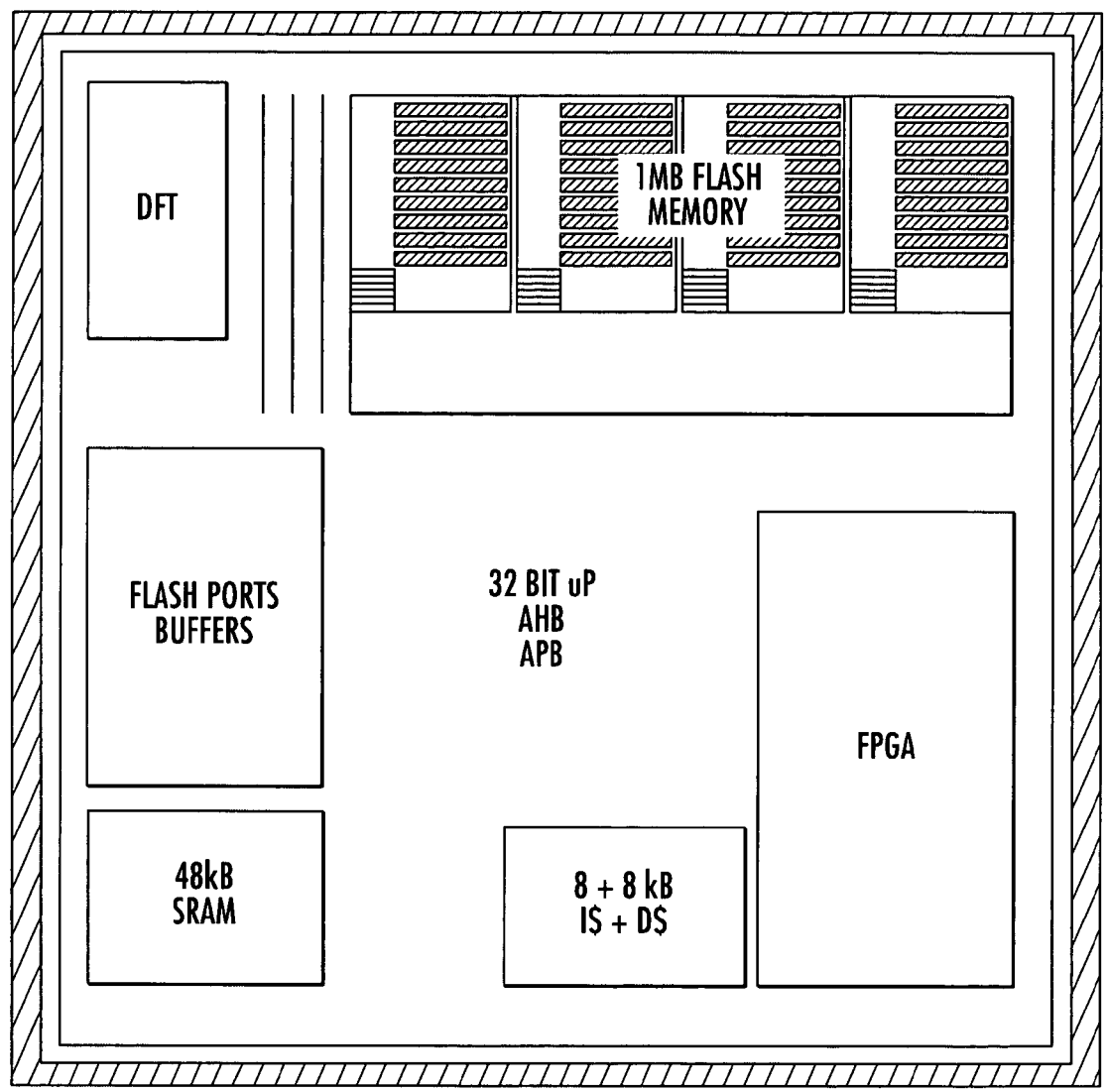
FIG. 7 is a schematic chip micrograph according to the present invention.

The full-processing unit on a single chip is implemented in a 0.18 µm, 2 PL-6 ML CMOS embedded Flash technology. Chip area is 70 mm$^2$, and the technology and device characteristics are summarized in FIG. 6. A chip micrograph is shown in FIG. 7.

That which is claimed is:

1. A dynamically reconfigurable processing unit comprising:
    a system bus;
    a microprocessor coupled to said system bus;
    at least one coprocessor coupled to said system bus;
    an embedded Flash memory for nonvolatile storage of code, data and bit-streams, said embedded Flash memory comprising a field programmable gate array (FPGA) port;
    a direct memory access (DMA) channel; and
    an SRAM embedded FPGA comprising
        an FPGA programming interface connected to the FPGA port of said embedded Flash memory through said DMA channel,
        an instruction extension interface for extending a datapath of said microprocessor for supporting a set of additional microprocessor instructions,
        a master/slave interface for supporting said at least one coprocessor, and
        an input/output interface for interfacing with external sensors with application-specific communication protocols;
    said microprocessor, said at least one coprocessor, said system bus, said embedded Flash memory, said DMA channel and said SRAM embedded FPGA being integrated as a single chip.

2. A dynamically reconfigurable processing unit according to claim 1, wherein said embedded Flash memory further comprises a code port and a data port; and wherein said DMA channel handles bit-stream transfers while said microprocessor fetches instructions and data from the code and data ports.

3. A dynamically reconfigurable processing unit according to claim 1, wherein said embedded Flash memory comprises:
    a modular array structure comprising N memory modules;
    a power memory arbiter (PMA); and
    a charge pump connected to said PMA and being shared among said N memory modules.

4. A dynamically reconfigurable processing unit according to claim 2, wherein the code port of said embedded Flash memory is for optimizing random access time and an application system supported by the reconfigurable processing unit; the data port of said embedded Flash memory is for allowing access to application data for modification thereof; and the FPGA port of said embedded Flash memory is for providing serial access for downloading the bit-streams for an embedded FPGA configuration.

5. A dynamically reconfigurable processing unit according to claim 2, wherein the FPGA port of said embedded Flash memory comprises four configuration registers replicating information stored in the code port to be used for writing data for embedded FPGA configurations.

6. A dynamically reconfigurable processing unit according to claim 4, wherein the FPGA port uses a chip select signal to access addressable memory space, and a burst enable signal to allow burst serial access.

7. A dynamically reconfigurable processing unit according to claim 1, further comprising a system bus connected to said DMA channel and said embedded Flash memory.

8. A dynamically reconfigurable processing unit according to claim 4, wherein said embedded Flash memory comprises four modules, each module being arranged in at least three programmable user-defined partitions, with each partition being dedicated to a corresponding port.

9. A reconfigurable processing unit comprising:
a microprocessor;
a system bus connected to said microprocessor;
an embedded Flash memory comprising a code port and a data port connected to said system bus for interfacing with said microprocessor, and a field programmable gate array (FPGA) port, said embedded Flash memory comprising four modules, each module being arranged in at least three programmable user-defined partitions, with each partition being dedicated to a corresponding port;
a direct memory access (DMA) channel connected to said system bus and to the FPGA port of said embedded Flash memory; and
an embedded FPGA comprising an FPGA programming interface connected to said DMA channel for interfacing with the FPGA port of said Flash memory.

10. A reconfigurable processing unit according to claim 9, wherein said microprocessor, said embedded Flash memory, said DMA channel and said embedded FPGA are integrated as a single chip.

11. A reconfigurable processing unit according to claim 9, wherein said embedded FPGA comprises an SRAM embedded FPGA.

12. A reconfigurable processing unit according to claim 9, wherein said embedded Flash memory comprises:
a modular array structure comprising N memory modules;
a power memory arbiter (PMA); and
a charge pump connected to said PMA and being shared among said N memory modules.

13. A reconfigurable processing unit according to claim 9, further comprising coprocessors connected to said system bus; wherein said embedded FPGA comprises:
an instruction extension interface for extending a datapath of said microprocessor for supporting a set of additional microprocessor instructions;
a master/slave interface for supporting said coprocessors; and
an input/output interface for interfacing with external units or sensors with application-specific communication protocols.

14. A reconfigurable processing unit according to claim 9, wherein the code port of said embedded Flash memory is for optimizing random access time and an application system supported by the reconfigurable processing unit; the data port of said embedded Flash memory is for allowing access to application data for modification thereof; and the FPGA port of said embedded Flash memory is for providing serial access for downloading bit-streams for an embedded FPGA configuration.

15. A reconfigurable processing unit according to claim 9, wherein the FPGA port of said embedded Flash memory comprises four configuration registers replicating information stored in the code port to be used for writing data for embedded FPGA configurations.

16. A reconfigurable processing unit according to claim 14, wherein the FPGA port uses a chip select signal to access addressable memory space, and a burst enable signal to allow burst serial access.

17. A method for making a reconfigurable processing unit comprising:
connecting a microprocessor and at least one coprocessor to a system bus;
connecting a code port and a data port of an embedded Flash memory to the system bus for interfacing with the microprocessor, the embedded Flash memory also comprising a field programmable gate array (FPGA) port;
connecting a direct memory access (DMA) channel to the system bus and to the FPGA port of the embedded Flash memory; and
connecting an FPGA programming interface of an embedded FPGA to the DMA channel for interfacing with the FPGA port of the embedded Flash memory, the embedded FPGA comprising an instruction extension interface for extending a datapath of the microprocessor for supporting a set of additional microprocessor instructions, a master/slave interface for supporting the at least one coprocessor, and an input/output interface for interfacing with external sensors with application-specific communication protocols.

18. A method according to claim 17, wherein the microprocessor, the at least one coprocessor, the system bus, the embedded Flash memory, the DMA channel and the embedded FPGA are integrated as a single chip.

19. A method according to claim 17, wherein the embedded FPGA comprises an SRAM embedded FPGA.

20. A method according to claim 17, wherein the embedded Flash memory comprises a modular array structure comprising N memory modules, a power memory arbiter (PMA), and a charge pump connected to the PMA and being shared among the N memory modules.

21. A method according to claim 17, wherein the code port of the embedded Flash memory is for optimizing random access time and an application system supported by the reconfigurable processing unit; the data port of the embedded Flash memory is for allowing access to application data for modification thereof; and the FPGA port of the embedded Flash memory is for providing serial access for downloading bit-streams for an embedded FPGA configuration.

22. A method according to claim 17, wherein the FPGA port of the embedded Flash memory comprises four configuration registers replicating information stored in the code port to be used for writing data for embedded FPGA configurations.

23. A method according to claim 17, wherein the embedded Flash memory comprises four modules, each module being arranged in at least three programmable user-defined partitions, with each partition being dedicated to a corresponding port.

24. A method according to claim 21, wherein the FPGA port uses a chip select signal to access addressable memory space, and a burst enable signal to allow burst serial access.

25. A method for making a reconfigurable processing unit comprising:
connecting a microprocessor to a system bus;
connecting a code port and a data port of an embedded Flash memory to the system bus for interfacing with the microprocessor, the embedded Flash memory also comprising a field programmable gate array (FPGA) port and four modules, with each module being arranged in at least three programmable user-defined partitions, and with each partition being dedicated to a corresponding port;
connecting a direct memory access (DMA) channel to the system bus and to the FPGA port of the embedded Flash memory; and
connecting an FPGA programming interface of an embedded FPGA to the DMA channel for interfacing with the FPGA port of the embedded Flash memory.

26. A method according to claim 25, wherein the microprocessor, the embedded Flash memory, the DMA channel and the embedded FPGA are integrated as a single chip.

27. A method according to claim 25, wherein the embedded FPGA comprises an SRAM embedded FPGA.

28. A method according to claim 25, wherein the embedded Flash memory comprises a modular array structure comprising N memory modules, a power memory arbiter (PMA), and a charge pump connected to the PMA and being shared among the N memory modules.

29. A method according to claim 25, further comprising connecting coprocessors to the system bus; wherein the embedded FPGA comprises:

an instruction extension interface for extending a datapath of said microprocessor for supporting a set of additional microprocessor instructions;

a master/slave interface for supporting the coprocessors; and an input/output interface for interfacing with external units or sensors with application-specific communication protocols.

30. A method according to claim 25, wherein the code port of the embedded Flash memory is for optimizing random access time and an application system supported by the reconfigurable processing unit; the data port of the embedded Flash memory is for allowing access to application data for modification thereof; and the FPGA port of the embedded Flash memory is for providing serial access for downloading bit-streams for an embedded FPGA configuration.

31. A method according to claim 25, wherein the FPGA port of the embedded Flash memory comprises four configuration registers replicating information stored in the code port to be used for writing data for embedded FPGA configurations.

32. A method according to claim 30, wherein the FPGA port uses a chip select signal to access addressable memory space, and a burst enable signal to allow burst serial access.

* * * * *

UNITED STATES PATENT AND TRADEMARK OFFICE
CERTIFICATE OF CORRECTION

PATENT NO. : 7,360,068 B2  Page 1 of 1
APPLICATION NO. : 10/768401
DATED : April 15, 2008
INVENTOR(S) : Michelle Borgatti et al.

It is certified that error appears in the above-identified patent and that said Letters Patent is hereby corrected as shown below:

Column 2, Line 63    Delete: "includes"
                     Insert: --include--

Column 4, Line 38    Delete: "increase"
                     Insert: --increases--

Column 4, Line 47    Delete: "in"

Column 5, Line 28    Delete: "accounts"
                     Insert: --that account--

Column 5, Line 39    Delete: "1.8xto"
                     Insert: --1.8x to--

Signed and Sealed this

Twenty-third Day of September, 2008

JON W. DUDAS
*Director of the United States Patent and Trademark Office*